United States Patent [19]
Bland et al.

[11] Patent Number: 5,703,537
[45] Date of Patent: Dec. 30, 1997

[54] PHASE-LOCKED LOOP CLOCK CIRCUIT FOR GENERATION OF AUDIO SAMPLING CLOCK SIGNALS FROM VIDEO REFERENCE SIGNALS

[75] Inventors: Christopher J. Bland; Jan Gazda; Barry E. Olsen, all of San Jose, Calif.

[73] Assignee: MicroClock Incorporated, San Jose, Calif.

[21] Appl. No.: 678,449

[22] Filed: Jul. 3, 1996

[51] Int. Cl.⁶ .................................................. H03L 7/18
[52] U.S. Cl. ........................ 331/1 A; 331/25; 331/60; 331/74
[58] Field of Search ..................... 331/1 A, 25, 74, 331/60

[56] References Cited

U.S. PATENT DOCUMENTS

| | | | |
|---|---|---|---|
| 5,140,284 | 8/1992 | Petersson et al. | 331/25 |
| 5,180,992 | 1/1993 | Akiyama et al. | 331/25 |
| 5,184,350 | 2/1993 | Dara | 331/49 |
| 5,278,814 | 1/1994 | Deguchi et al. | 369/47 |

*Primary Examiner*—Siegfried H. Grimm
*Attorney, Agent, or Firm*—Townsend and Townsend and Crew LLP

[57] ABSTRACT

A circuit with a phase-locked loop circuit which generates audio clock signals with zero ppm error from reference clock signals at a reference frequency is presented. The phase-locked loop (PLL) circuit has a first programmable divider circuit connected to the circuit input terminal, a first fixed divider circuit connected to the PLL output terminal and a second programmable divider circuit connected to the first fixed divider circuit, among other elements. The circuit also has several second fixed divider circuits, each second fixed divider circuit connected to the PLL output terminal, and a multiplexer selectively connecting the second fixed divider circuits to the circuit output terminal responsive to a programmable control signal. By properly selecting the integer divisors for the fixed and programmable divisors, the circuit can generate clock signals at any one of the audio sampling frequencies from a video clock signal.

12 Claims, 3 Drawing Sheets

PHASE-LOCKED LOOP CLOCK CIRCUIT FOR GENERATION OF AUDIO SAMPLING CLOCK SIGNALS FROM VIDEO REFERENCE SIGNALS

BACKGROUND OF THE INVENTION

The present invention is related to clock circuits and, more particularly, to phase-locked loop (PLL) clock circuits for generating clock signals from a video clock signal.

Both MPEG 1 and MPEG 2 compression (encoding) and decompression (decoding) techniques are widely used for digital video and audio applications. These MPEG (Motion Picture Experts Group), techniques allow both still pictures and moving video signals to be digitized and the resulting data stream compressed. This data can then be either stored in a smaller amount of memory or transmitted digitally using a relatively narrow bandwidth. The master clock frequency for an MPEG datastream is 27 MHz.

In addition to the video signals, the data stream includes digital audio signals. To encode (or digitize) the original audio signal (which is continuous and analog), an analog-to-digital converter (A/D) is used. This results in a digital data stream. The A/D is clocked at an audio sampling rate. There are three main MPEG defined and supported rates: 32 KHz, 44.1 kHz and 48 kHz.

To reconstruct the audio signals at the receiver, the digital audio datastream is decoded and fed into a digital-to-analog converter (DAC). The DAC generally used is an oversampling converter. This requires a clock signal at a multiple, either 256 or 384, of the audio sampling rate. This multiple, when combined with each sampling rate, gives six possible audio frequencies.

32 kHz×256=8.192 MHz 32 kHz×384=12.288 MHz 44.1 kHz×256=11.2896 MHz 44.1 kHz×384=16.9344 MHz 48 kHz×256=12.288 MHz 48 kHz×384=18.432 MHz

Two of these frequencies are the same, which results in five different frequencies for audio oversampling clock frequencies. It is desirable that these clock frequencies be exact, i.e., that they have zero parts per million (0 ppm) error. If they are not, the digital audio track signals are no longer synchronized with the video signals. This periodically causes spurious noises, such as pops, cracks, or silence. Such noises occur when the system resynchronizes the audio signals to the video signals. In practice, the audio data is temporarily stored in a buffer memory. If this audio data is not clocked out at a proper frequency, then the buffer memory can either fill (overflow) or empty completely. This then causes the spurious noises.

A further problem arises if the MPEG clock signals drift from the exact 27 MHz frequency. This can occur when different encoding or transmission techniques are used. In this case, it is desirable to have the audio frequencies exactly track the MPEG clock. So, for example, if the MPEG clock signal is 200 ppm (parts per million) fast at 27.0054 MHz, the frequency of the audio clock signals should also increase by 200 ppm to maintain synchronization.

In some systems, no attempt is made to solve the problem and the system generates these periodic noises. Existing solutions to this problem are either expensive, cumbersome, or both. Also, they do not often work very well.

One solution is to use a voltage-controlled crystal oscillator (VCXO) to generate the audio clock signals. This requires a VCXO for each frequency used. The synchronization between the video and audio signals is monitored by digital logic, which generates an error signal when synchronization is lost. This error signal is converted to a voltage that tunes the VCXO and so keeps the audio frequency exact. The problems with this system is that VCXOs are expensive and the system is difficult to implement.

Another solution uses purely digital logic, which again is used to monitor the synchronization between the audio and video signals. As the audio signals run faster or slower than the video signals, the digital logic either deletes or adds clock cycles to the audio clock signals. This maintains synchronization with a minimum of spurious noises. However, this system is again very difficult and cumbersome to implement.

On the other hand, the present invention allows the generation of audio clock signals with zero ppm error. An inexpensive CMOS PLL clock synthesizer is used. In addition to tracking any small variations in the MPEG clock signals, the present invention greatly reduces the amount (and therefore the cost) of buffer memory required.

SUMMARY OF THE INVENTION

The present invention provides for a circuit which generates audio clock signals with zero parts per million error at an output terminal from reference clock signals at a reference frequency received at an input terminal. The circuit has a phase-locked loop (PLL) circuit which has a first programmable divider circuit connected to the circuit input terminal, a first fixed divider circuit connected to the PLL output terminal, a second programmable divider circuit connected to the first fixed divider circuit, a loop filter circuit for supplying a reference voltage, a voltage-controlled oscillator having an output node connected to the PLL output terminal and an input node connected to the loop filter circuit, a phase detector having a first input node connected to an output node of the first programmable divider circuit and a second input node connected to an output node of the second programmable divider circuit, and a charge pump connected to the phase detector and to the loop filter circuit. The circuit also has a plurality of second fixed divider circuits, each second fixed divider circuit connected to the PLL output terminal, and a multiplexer selectively connecting the second fixed divider circuits to the circuit output terminal responsive to a programmable control signal.

By properly selecting the integer divisors for the fixed and programmable divisors, the circuit can generate clock signals at any one of the audio sampling frequencies from a video clock signal.

DETAILED DESCRIPTION OF PREFERRED EMBODIMENTS

It should be noted that in the description below of the elements of phase-locked loops (PLLs), the terms divider circuits and counters, are used interchangeably. Counters operate as divider circuits. One term, or the other, is used to best describe the element and operation of the circuit.

Figure 1:
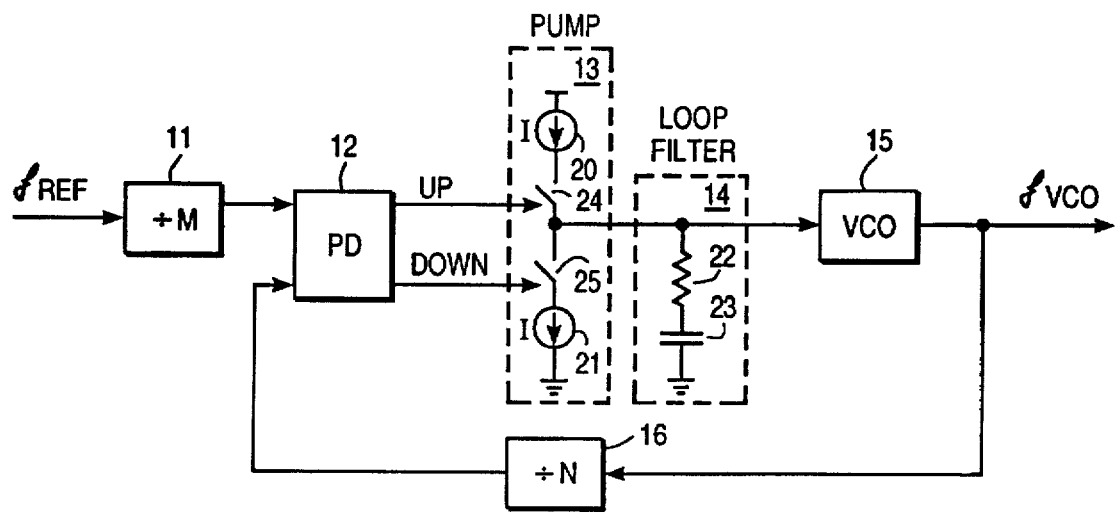
FIG. 1 is a block diagram of a conventional phase-locked loop circuit.

FIG. 1 shows a block diagram of a conventional PLL for frequency synthesis. The PLL receives a signal with a reference frequency $f_{REF}$ at the PLL's input terminal. That terminal is connected to an input terminal of a divider circuit 11, which divides, or slows, the incoming signal by predetermined amount M. The output of divider circuit 11 is connected to one of two inputs of a phase detector circuit 12, which has its output connected to a charge pump circuit 13. The charge pump circuit is represented by switches 24 and 25 which are responsive to the phase detector circuit 12 and are connected to current source circuits 20 and 21 respectively. The charge pump circuit 13 is also connected to a loop filter circuit, a series-connected capacitor 23 and resistor 22, which provides a reference voltage to a voltage-controlled oscillator (VCO) 15 and is connected to the input terminal of the voltage-controlled oscillator. The VCO 15 has an output terminal forming the output terminal of the PLL.

The output terminal of the VCO 15 is also connected to a second divider circuit 16, which divides the frequency of the output signal by a predetermined amount N. A feedback relationship is established by the connection of the output of the divider circuit 16 to the second input of the phase detector circuit 12.

The operation of the PLL is as follows. The clock frequencies of the two input signals to the phase detector 12 are $f_{REF}/M$ and $f_{VCO}/N$ and the feedback arrangement of the PLL circuit keeps the two frequencies the same. The phase detector 12 compares the phase and frequency of the rising edges of the two input signals and generates one of three states. If the phase and frequency of the two input signals are the same, the loop is locked. Neither UP nor DOWN signal is asserted and the two switches 24 and 25 in the charge pump 13 remain open. The voltage stored on the loop filter capacitor 23 is unchanged and the voltage-controlled oscillator (VCO) 15 continues to run at the same frequency.

If the reference input to the phase detector circuit 12 is running faster than the VCO input, the output signal of the VCO 15 is running at too slow a frequency. In this case, the phase detector 12 generates an UP signal which turns on the upper switch 24 in the charge pump circuit 13 and so charges the loop filter capacitor 23 from the current source circuit 20. This raises the frequency of the VCO 15 signal until the two input signals to the phase detector circuit 12 are the same.

Conversely, if the reference input signal to the phase detector circuit 12 is running slower than the VCO output signal, the VCO 15 is running too fast. In this case, the phase detector circuit 12 generates a DOWN signal that turns on the lower switch 25 in the charge pump circuit 13 and so discharges the loop filter capacitor 23 through the current source circuit 21. This lowers the speed of the VCO 15 until the two input signals to the phase detector circuit 12 are the same.

As described above, a property of phase-locked loops in a steady state condition is that the feedback loop (the phase detector 12, charge pump 13, loop filter 14, VCO 15 and the divider circuit 16) makes the frequencies of the two input signals to the phase detector 12 equal. Since one input is $f_{REF}$ divided by M and the other input is $f_{VCO}$ divided by N then:

$$\frac{f_{REF}}{M} = \frac{f_{VCO}}{N} \text{ ; or}$$

$$f_{VCO} = \frac{N}{M} f_{REF}$$

This is the basic equation for frequency synthesis and allows the generation of frequencies that are fractions of a reference frequency (the fraction can be greater than one).

Frequency synthesis is now also used in computers and allows a high frequency clock to be generated from a lower frequency reference clock. This function is generally integrated onto a CMOS integrated circuit called a clock generator or clock synthesizer. A major problem with these integrated circuits is the accuracy of the synthesized clock. This is determined by the equation above and the characteristics of CMOS PLLs.

In the present invention, the 27 MHz MPEG clock signal is used as a reference signal for the PLL. The relationship of the frequencies of the audio clock signals to 27 MHz video clock signal is then as follows:

$$8.192 \text{ MHz} = \frac{1024}{3375} \cdot 27 \text{ MHz}$$

$$11.2896 \text{ MHz} = \frac{784}{1875} \cdot 27 \text{ MHz}$$

$$12.288 \text{ MHz} = \frac{512}{1125} \cdot 27 \text{ MHz}$$

$$16.9344 \text{ MHz} = \frac{784}{1250} \cdot 27 \text{ MHz}$$

$$18.432 \text{ MHz} = \frac{512}{750} \cdot 27 \text{ MHz}$$

These numbers can be directly substituted into the PLL equation above to give the exact audio frequencies. However, there are problems with a conventional CMOS PLL. For example, the 8.192 MHz clock signal requires M=3375. This means that the frequency at the phase detector 12 is 27 MHz divided by 3375, which is 8 kHz. In practical terms, this requires a very large loop filter capacitor 23 to keep the loop stable. The loop bandwidth should be less than the phase detector frequency. The required capacitor will be larger than can be integrated onto a CMOS chip. Furthermore, the ratio of the final output frequency to the phase detector frequency is large (e.g., 8.192 MHz to 8 kHz). This causes an output clock signal with a large amount of noise which manifests itself as clock jitter. This may cause problems in the audio system. In practice, the phase detector frequency should be closer to the frequency of the VCO, i.e, the phase detector frequency should be greater than 200 kHz for capacitor values that can be reasonably integrated.

Figure 2:
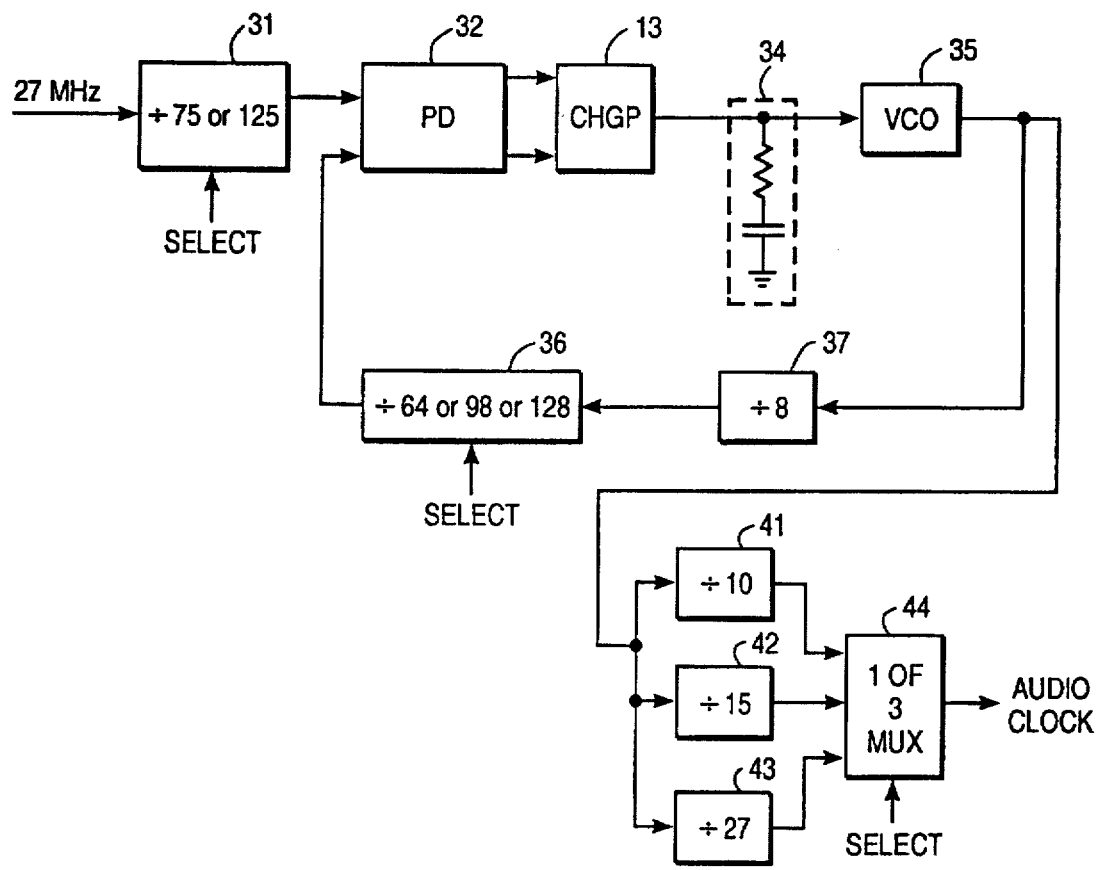
FIG. 2 is a block diagram of a clock circuit using a PLL according to one embodiment of the present invention.

The present invention uses a conventional PLL. Nonetheless, the problems above are avoided. FIG. 2 illustrates a clock circuit, which has a PLL and which is programmable to generate clock signals at any one of five of the audio sampling frequencies from the 27 MHz MPEG clock signal.

The FIG. 2 clock circuit has the conventional PLL as described above. A divider circuit 31 receives the MPEG clock signal as a reference signal. The output of the divider circuit 31 is connected to a phase detector circuit 32, which has its UP and DOWN control terminals connected to a charge pump circuit 33. The output of the charge pump 33 is connected to a voltage-controlled oscillator 35 and to a loop filter circuit 34 to supply a reference voltage to the VCO 35. In the feedback path, a prescalar divider circuit (divide-by-8) 37 has an input terminal connected to the output terminal of the VCO 35. The divider circuit 37, being fixed and with a divisor of a multiple of 2, can stably divide the signal with no problems.

The output terminal of the fixed divider circuit 37 is connected to an input terminal of a second feedback divider circuit 36, which has its output terminal connected to the second input terminal of the phase detector circuit 32. The divider circuits 31 and of the PLL are programmable, i.e., they have control terminals which are connected to storage elements, such as registers or ROMs, which can hold the value of the divisors of the divider circuits 31 and 36.

The output terminal of the PLL, the output terminal of the VCO 35, is connected to three fixed divider circuits 41–43. The output terminals of each divider circuit 41–43 is connected to a multiplexer 44, which is programmed to select one of the divider circuits 41–43 to the output terminal of the multiplexer 44, the output terminal of the FIG. 2 clock circuit. The clock circuit receives the MPEG clock signal at 27 MHz and generates a clock signal at one of the audio sampling frequencies.

The five audio sampling frequencies can be arranged with respect to MPEG frequency as follows:

$$8.192 \text{ MHz} = \frac{8 \times 128}{125 \times 27} \ 27 \text{ MHz}$$

$$11.2896 \text{ MHz} = \frac{8 \times 98}{125 \times 15} \ 27 \text{ MHz}$$

$$12.288 \text{ MHz} = \frac{8 \times 64}{75 \times 15} \ 27 \text{ MHz}$$

$$16.9344 \text{ MHz} = \frac{8 \times 98}{125 \times 10} \ 27 \text{ MHz}$$

$$18.432 \text{ MHz} = \frac{8 \times 64}{75 \times 10} \ 27 \text{ MHz}$$

The N divider circuit 16 of FIG. 1 is implemented by the pre-divider circuit 37 of 8 followed by the programmable divider circuit 36 which can be programmed to divide by 64, 98 or 128. In practice, the divider circuits 36 and 37 can be implemented as any combination of predivider and divider circuits to give total divisions of 512, 784 or 1024. In contrast, the M divider circuit 11 of FIG. 1 is implemented as the programmable divider circuit 31 to divide by 75 or 125. This phase detector frequency is now either 360 kHz or 216 kHz, both of which are higher than 200 kHz mentioned above. However, in each equation this still leaves one factor unaccounted for. This is implemented by three separate and fixed output divider circuits 41–43, which divide by 10, 15 or 27. These output divider circuits 41–43 are implemented as symmetrical divider circuits so that the output has a 50% duty cycle. The output divider circuits 41–43 are followed by a 3-to-1 multiplexer (MUX) 44.

This design is used rather than a programmable divider circuit for two reasons. Firstly, the divider circuit must run between 169 MHz and 221 MHz. It is difficult to design a programmable divider circuit that operates at these frequencies. Secondly, two of the output divides are odd numbers and again it is difficult to design a programmable divider circuit which divides by an odd number and which has a good duty cycle.

Figure 3:
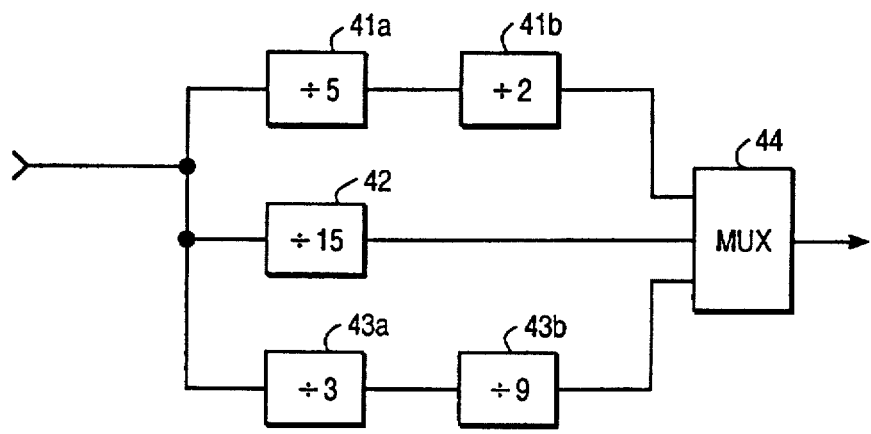
FIG. 3 is a block diagram of the output divider circuits in the clock circuit of FIG. 2.

FIG. 3 shows the details of the output divider circuits 41–43 and the multiplexer 44. The divide-by-10 output divider circuit 41 is implemented as a divide-by-5 divider circuit 41A followed by a divide-by-2 divider circuit 41B. This gives a perfect 50% duty cycle the duty cycle of the divide-by-5 divider circuit 41A is unimportant since it is followed by a divide-by-2 divider circuit 41B. The divide-by-27 divider circuit 43 is implemented as a divide-by-3 divider circuit 43A followed by a divide-by-9 divider circuit 43B. The divide-by-15 divider circuit 42 is not broken up. The divide-by-9 divider circuit 43B and the divide-by-15 divider circuit 42 both use a special divider circuit to ensure a good duty cycle while operating at high-speed and dividing by an odd number.

Figure 4A:
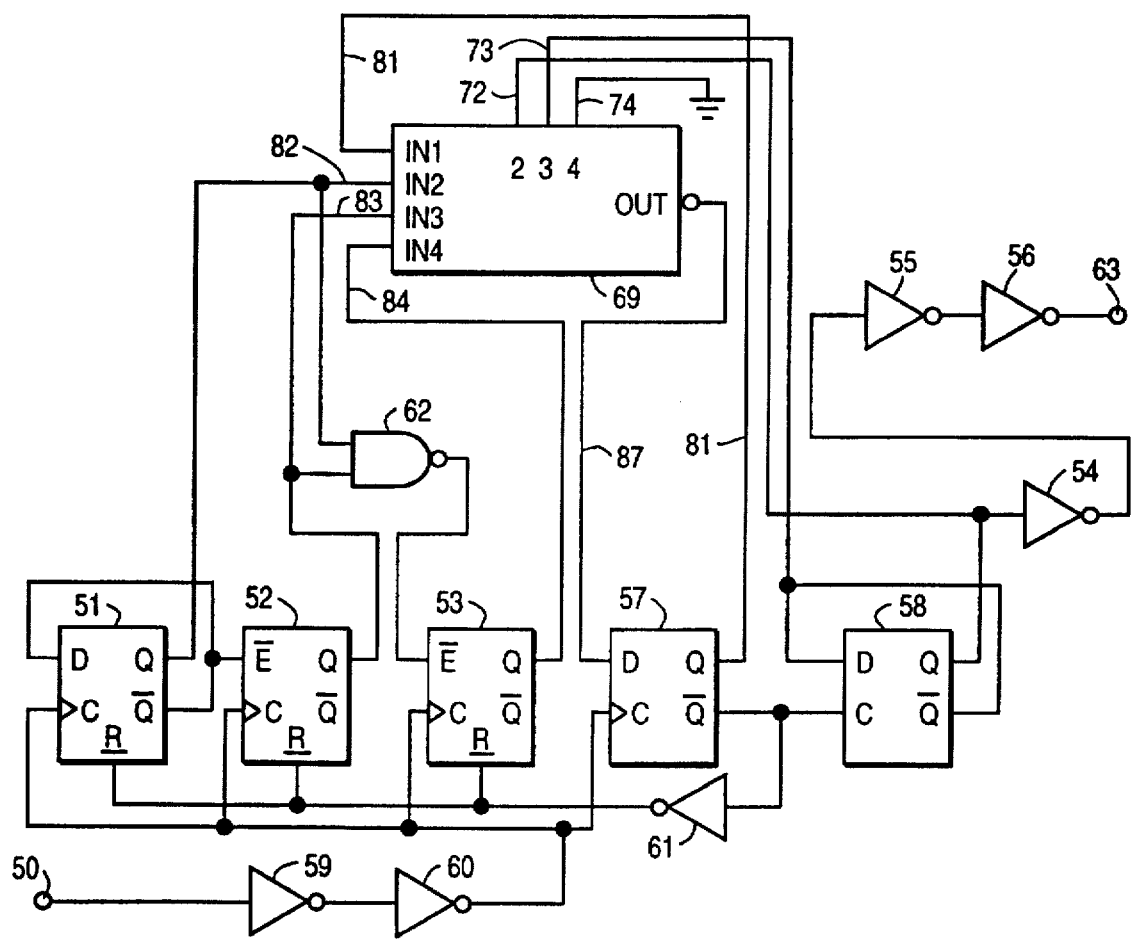
FIG. 4A is a detailed circuit diagram of one of the output divider circuits of FIG. 3.

FIG. 4A is a schematic diagram of this special divider circuit, in this case, the divide-by-15 divider circuit 42. Conceptually the divider circuit operates by counting up to 7, then counting up to 8, before counting up to 7 again, and so on. The output toggles at the completion of each count giving a 7/(7+8) duty cycle which is 46.6%, or close to 50%.

The divider circuit has an input terminal 50 which is connected to the first of two serially connected inverters 59 and 60. The output terminal of the second inverter 60 is connected to the clock input terminals of four flip-flops 51–53 and 57. The inverted QBAR output terminal of the flip-flop 51 is connected to its own D input terminal and to the EBAR input terminal of the second flip-flop 52. The noninverted Q output terminal of the flip-flop 51 is connected by a line 82 to an input terminal IN2 of a logic block 67 and the first input terminal of a NAND logic gate 62.

The noninverted output terminal of the second flip-flop 52 is connected by a line 83 to a third input terminal IN3 of the logic block 67 and the second input terminal of the NAND logic gate 62. The output terminal of the NAND logic gate 62 is connected to the EBAR input terminal of the flip-flop 53, which has its noninverted Q output terminal connected by a line 84 to an input terminal IN4 of the logic block 67.

The output terminal of the logic block 67 is connected by a line 87 to the D input terminal of the flip-flop 57, which has its noninverting Q output terminal connected by a line 81 back to an input terminal IN1 of the logic block 67. The inverting QBAR output terminal of the flip-flop 57 is connected to the clock input terminal of a fifth flip-flop 58 and to the input terminal of an inverter 61. The inverter 61 has its output terminal connected to the inverted RESET terminals of the flip-flops 51–53.

The fifth flop-flop 58 has its D input terminal connected to its own inverting QBAR output terminal and to an input terminal R3 of the logic block 67 by a line 73. The noninverting Q output terminal is connected by a line 72 to an R2 input terminal line of the logic block 67 and to the first of three serially connected inverters 54–56. The output terminal of the last inverter 56 is connected to the output terminal 63 of the divider circuit. A line 74 to an input terminal R4 of the logic block 67 is tied to ground, i.e., logic 0.

Figure 4B:
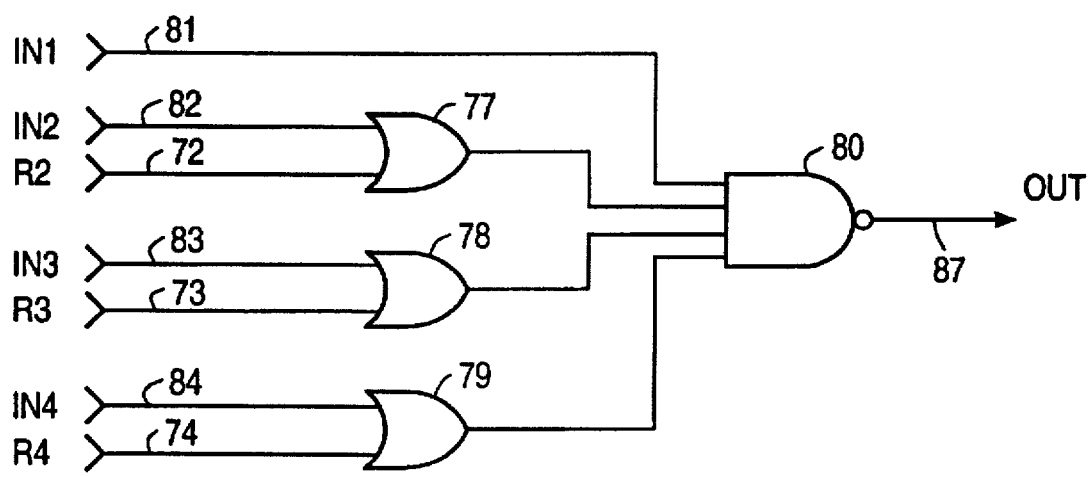
FIG. 4B is a logic diagram of one of the elements of the FIG. 4A output divider circuit.

The logic block 67 operates so that when the line 81, either the lines 72 or 82, either the lines 73 or 83, and either the lines 74 or 84, are all high, i.e., logic 1, the output of the block 67 on the line 87 is low, i.e., logic 0. The logic block 67 is detailed in FIG. 4B. The logic block 67 has three OR logic gates 77–79, each of whose output terminals are connected to an input terminal of a four-input NAND logic gate 80 whose output terminal is connected to the line 87. The fourth input terminal of the NAND logic gate 80 represents the IN1 input terminal and is connected to the line 81. The OR logic gates 77–79 have two input terminals each. The input terminals of the logic gate 77 are connected to the lines 72 and 82; the input terminals of the logic gate 78 are connected to the lines 73 and 83; and the input terminals of the logic gate 79 are connected to the lines 74 and 84.

The circuit operates as follows. The flip-flops 51–53 and 57, inverters 59–61, and the NAND logic gate 62 and the logic block 67 form a synchronous counter. The flip-flops 51, 57 and 58 are D-type flip-flops 51 and 58, connected as toggle flip-flops. The devices 52 and 53 are toggle flip-flops enabled by the signal at the EBAR input terminal. When the EBAR signal is low, the outputs of these flip-flops 52 and 53 change on each rising clock edge. When the EBAR signal is high, the outputs remain unchanged as the flip-flops are clocked.

The number that is counted is controlled by the logic signals on the lines 72–74 to input terminals R2, R3 and R4 of the logic block 67. The R2 line 72 carries the least significant bit (LSB) and the R4 line 74 carries the most significant bit (MSB). The flip-flops 51–53 count up to the complement of the binary number presented on the R lines 72–74, at which point the output of the logic block 67 goes low.

On the next clock cycle, the low output of the logic block 67 is clocked through the flip-flop 57 which performs three functions. Firstly, it resets the synchronous divider via the inverter 61. Secondly, the Q output of the flip-flop 57 goes low which feeds back into the logic block 67 forcing the output of the logic block 67 high. This is done to speed up the resetting of the counter. Thirdly, it clocks the flip-flop 58 which is connected so that on each clock input transition going high, the output of the flip-flop 58 toggles.

When the flip-flop 58 toggles, the number presented on the R lines changes. On the next clock the reset is cleared from the synchronous divider (since the output of the logic gate block went high) so that on the next clock cycle the synchronous counter can begin to count up to the complement of the new number presented on the R lines. Of course, it should be readily evident that the logic block 67 may be modified so that it is responsive to the binary number on the R lines 72–74, rather than its complement. As described herein, the logic block 67 has the advantage of design simplicity.

The counter counts up to R*+2, where R* is the complement of R, and the 2 from the two clock cycles required to reset the counter and then clear the reset. By arranging the R lines 72–74 such that they are driven from the Q or QBAR output of the flip-flop 58 or are tied high or low, it is possible to make the synchronous divider count up to any two numbers. For example, to divide by 15 requires counting to 7, and then to 8. Since the synchronous counter adds 2 to each count, then the number presented on the R lines 72–74 should be the complement of 5 and 6. These numbers are "010" and "001" in binary. Writing one above the other gives:

| R4 | R3 | R2 |
|----|----|----|
| 0  | 1  | 0  |
| 0  | 0  | 1  |

This shows that R2 and R3 need to toggle in anti-phase while R4 is tied low. The R2 line 72 is tied to the Q output of the flip-flop 58 and R3 line 73 is tied to the QBAR output. The Q output of the flip-flop 58 also provides the divide-by-15 output after it has been buffered by the inverters 54–56.

To build a divide-by-9 divider circuit, the circuit above is modified to alternate between a divide-by-4 operation and a divide-by-5 operation.

While various preferred and alternate embodiments of the present invention have been disclosed and described in detail, it should be evident that the present invention is equally applicable by making appropriate modifications to the embodiment described above. Therefore, the above description should not be taken as limiting the scope of invention which is defined by the metes and bounds of the appended claims.

What is claimed is:

1. A circuit for generating audio clock signals at an output terminal from reference clock signals at a reference frequency received at an input terminal, said circuit comprising a phase-locked loop circuit generating a PLL output signal at a PLL output frequency at a PLL output terminal, said phase-locked loop circuit having a first programmable divider circuit connected to said input terminal for generating an output signal at said reference frequency divided by a variable integer A;

a first fixed divider circuit connected to said PLL output terminal for generating an output signal at said PLL output frequency divided by an integer B, a multiple of 2;

a second programmable divider circuit connected to said first fixed divider circuit for generating an output signal at said first fixed divider circuit output signal frequency divided by a programmable amount C;

a circuit for supplying a reference voltage;

a voltage-controlled oscillator having an output node connected to said PLL output terminal and an input node connected to said reference voltage supply circuit;

a phase detector having first and second input nodes, said first input node connected to an output node of said first programmable divider circuit, said second input node connected to an output node of said second programmable divider circuit, said phase detector generating an output signal indicative of a difference between said first and second programmable divider circuit output signals;

a charge pump connected to said phase detector and to said reference voltage supply circuit, said charge pump responsive to said phase detector output signal for varying said reference voltage of said reference voltage supply circuit so that the output frequency of said voltage-controlled oscillator varies;

a plurality of second fixed divider circuits, each second fixed divider circuit connected to said PLL output terminal for generating an output signal at said PLL output frequency divided by an integer D, each integer D differing from that of another second fixed divider circuit; and a multiplexer having input terminals connected to output terminals of said second fixed divider circuits, said multiplexer selectively connecting an output terminal of one of said second fixed divider circuits to said circuit output terminal responsive to a programmable control signal.

2. The circuit of claim 1 wherein said reference frequency is at 27 MHz.

3. The circuit of claim 2 wherein A is programmed to be either 75 or 125, and the product of B*C is programmed to be either 512, 784, or 1024.

4. The circuit of claim 3 wherein B is programmed to be 8, and C is programmed to be either 64, 98, or 128.

5. The circuit of claim 3 comprising three second fixed divider circuits, said integer D for each second fixed divider circuit being 10, 15 and 27 respectively.

6. A circuit for generating audio clock signals at an output terminal from reference clock signals at a reference frequency received at an input terminal, said circuit comprising a phase-locked loop circuit generating a PLL output signal at a PLL output frequency at a PLL output terminal;

a plurality of second fixed divider circuits, each second fixed divider circuit connected to said PLL output terminal for generating an output signal at said PLL output frequency divided by an integer D, each integer D differing from that of another second fixed divider circuit; and a multiplexer having input terminals connected to output terminals of said second fixed divider circuits, said multiplexer selectively connecting an output terminal of one of said second fixed divider circuits to said circuit output terminal responsive to a programmable control signal.

7. The circuit of claim 6 wherein at least one of said second fixed divider circuits comprises a synchronous counter responsive to said PLL output frequency, said counter alternately counting up to N and N+1, wherein N+(N+1)=D.

8. The circuit of claim 7 wherein said at least one second fixed divider circuit comprises a circuit toggling between a first state and a second state responsive to said synchronous counter, said synchronous counter counting up to N responsive to said toggling circuit first state and counting up to N+1 responsive to said toggling circuit second state.

9. The circuit of claim 8 wherein said reference frequency is at 27 MHz.

10. The circuit of claim 9 wherein said phase-locked loop circuit has a first programmable divider circuit connected to said input terminal for generating an output signal at said reference frequency divided by a variable integer A;

a first fixed divider circuit connected to said PLL output terminal for generating an output signal at said PLL output frequency divided by an integer B, a multiple of 2;

a second programmable divider circuit connected to said first fixed divider circuit for generating an output signal at said first fixed divider circuit output signal frequency divided by a programmable amount C; and A is programmed to be either 75 or 125, and the product of B*C is programmed to be either 512, 784, or 1024.

11. The circuit of claim 10 wherein B is programmed to be 8, and C is programmed to be either 64, 98, or 128.

12. The circuit of claim 10 comprising three second fixed divider circuits, said integer D for each second fixed divider circuit being 10, 15 and 27 respectively.

* * * * *